United States Patent [19]
Heanue et al.

[11] Patent Number: 6,040,930
[45] Date of Patent: Mar. 21, 2000

[54] VOLUME HOLOGRAPHIC STORAGE USING ROTATED SIGNAL BEAM ENCODER

[75] Inventors: John F. Heanue, San Jose; Andrew J. Daiber, Palo Alto; James Colvin, Sunnyvale, all of Calif.

[73] Assignee: Siros Technologies, Inc., San Jose, Calif.

[21] Appl. No.: 09/071,428

[22] Filed: May 1, 1998

[51] Int. Cl.[7] .............................. G02B 5/32; G03H 1/26; G03H 1/00; G11C 13/04
[52] U.S. Cl. ................. 359/21; 359/22; 359/30; 365/125
[58] Field of Search .................... 359/10, 11, 21, 359/30, 29, 22; 365/124, 125, 216; 369/102, 103, 112

[56] References Cited

U.S. PATENT DOCUMENTS

| | | | |
|---|---|---|---|
| 4,920,220 | 4/1990 | Phaff | 544/90 |
| 5,339,305 | 8/1994 | Curtis et al. | 359/29 |
| 5,377,176 | 12/1994 | Redfield | 369/103 |
| 5,440,669 | 8/1995 | Rakuljic et al. | 359/7 |
| 5,450,218 | 9/1995 | Heanue et al. | 359/21 |
| 5,483,365 | 1/1996 | Pu et al. | 359/11 |

*Primary Examiner*—Audrey Chang
*Attorney, Agent, or Firm*—Lumen Intellectual Property Services

[57] ABSTRACT

The data encoder (e.g. an amplitude spatial light modulator, ASLM) in a volume holographic storage system is rotated by 45° relative to the normal to the plane of the reference and signal beams, such that the near-Fourier transform pattern of the encoder at the medium has an X-shape. The encoder rotation allows tight packing of spatial multiplexing subvolumes in a rectangular array, and provides for uniform spatial frequency filtering in a perpendicular geometry.

8 Claims, 4 Drawing Sheets

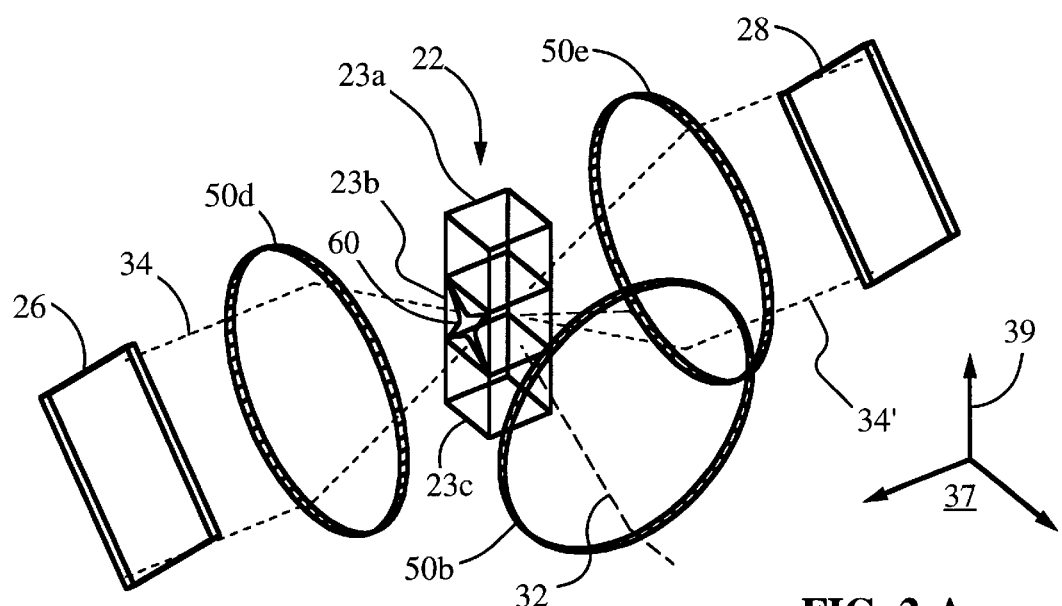
FIG. 2-A
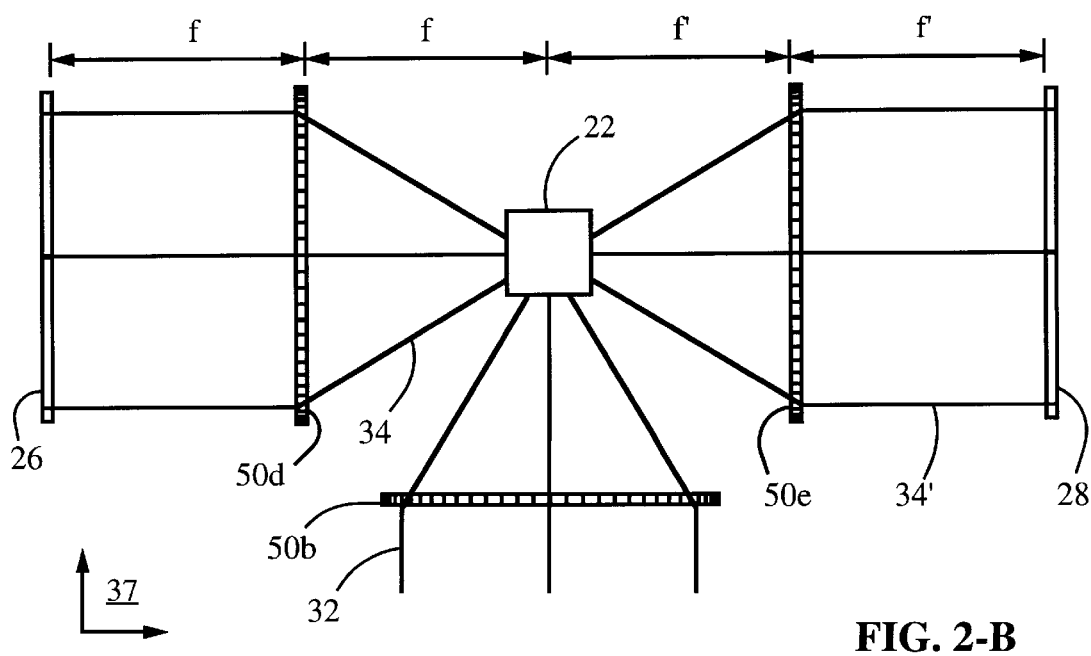
FIG. 2-B

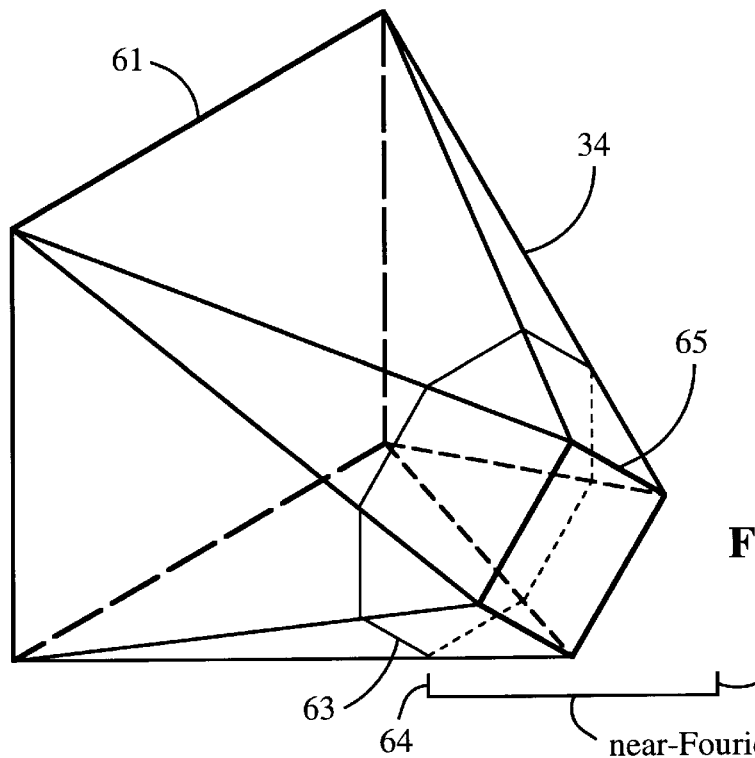
FIG. 4
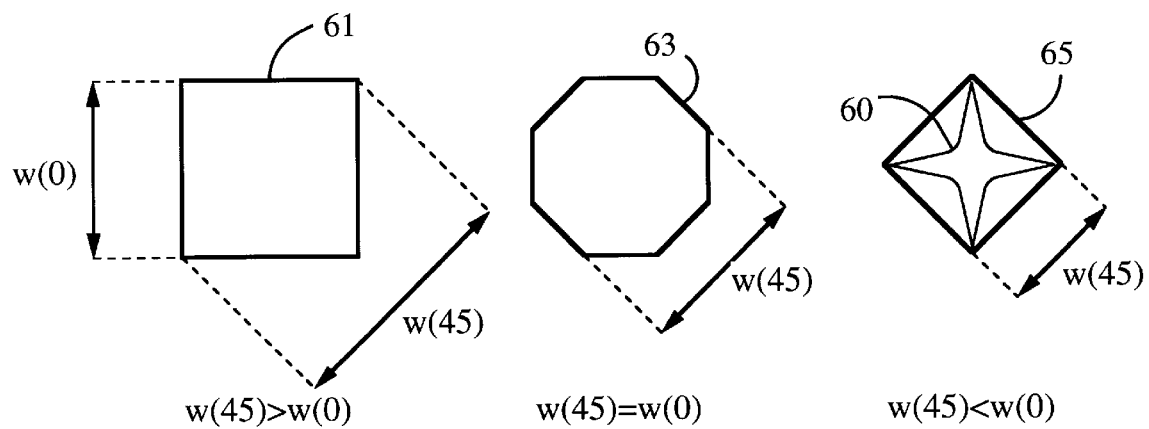
FIG. 5-A  FIG. 5-B  FIG. 5-C

VOLUME HOLOGRAPHIC STORAGE USING ROTATED SIGNAL BEAM ENCODER

U.S. GOVERNMENT RIGHTS

This invention was made with U.S. Government support under grant No. MDA972-94-2-0008, awarded by the ARPA-Industry-University Photorefractive Information Storage Materials (PRISM) Consortium. The U.S. Government has certain rights in this invention.

BACKGROUND

Page-based volume holographic storage has emerged as a promising new data storage approach. For information on conventional holographic storage see for example U.S. Pat. Nos. 4,920,220, 5,450,218, 5,440,669, and 5,377,176. In holographic storage, data is stored as a hologram resulting from the interference of a signal and reference beam. During storage, both the reference and signal beams are incident on the storage medium. During retrieval, only the reference beam is incident on the medium; the reference beam interacts with the stored hologram, generating a reconstructed signal beam proportional to the original signal beam used to store the hologram.

Each bit is typically stored as a hologram extending over the entire volume of the storage medium. Multiple bits are encoded and decoded together in pages, or two-dimensional arrays of bits. Multiple pages are stored within the volume by angular, wavelength, phase-code, or related multiplexing techniques. Each page can be independently retrieved using its corresponding reference beam. The parallel nature of the storage approach allows high transfer rates and short access times, since as many as $10^6$ bits within one page can be stored and retrieved simultaneously. Spatial multiplexing can be used to increase capacity through the use of multiple, independent storage subvolumes.

A data encoder situated in the signal beam path is normally used to encode data pages in the signal beam. The data encoder can be an amplitude spatial light modulator (ASLM) having a 2-D cartesian array of square regions corresponding to the data to be stored. The transmissivity of each region can be individually and dynamically adjusted. The data encoder can be situated in a Fourier or near-Fourier arrangement relative to the medium.

Disadvantages of conventional holographic storage systems include potential sub-optimal stacking of storage subvolumes in systems using spatial multiplexing, as well as non-uniform spatial frequency filtering of the signal beam. Such spatial frequency filtering may lead to loss of information encoded in the high-spatial-frequency components of the signal beam.

SUMMARY

It is a primary object of the present invention to provide a holographic storage system allowing improved stacking of storage subvolumes for spatial multiplexing. It is another object to allow tight volumetric packing of a cartesian array of storage subvolumes for spatial multiplexing. It is another object to provide a holographic storage system with reduced non-uniform spatial frequency filtering of the signal beam, reduced loss of information encoded by the high-spatial-frequency components of the signal beam, and reduced intersymbol interference which would otherwise be caused by such loss of information. It is still another object to provide for a relatively uniform distribution of the reference beam intensity over the high-spatial-frequency components of the signal beam.

The present invention provides a holographic data storage system comprising a holographic storage medium, a light source in optical communication with the medium, and a data encoder in optical communication with the light source and the medium. The light source generates a reference beam and a signal beam incident on the medium. The reference and signal beams define a beam plane and a normal to the beam plane. The data encoder is positioned in the path of the signal beam, and is optically obliquely oriented relative to the normal such that the cross-section of the signal beam at the medium is obliquely oriented relative to the normal. The data encoder encodes data pages in the signal beam for storage in the medium as volume holograms.

The present invention further provides a holographic data retrieval system comprising a holographic storage medium, a light source in optical communication with the medium, and a detector in optical communication with the medium. The medium comprises volume holograms stored therein. Each of the holograms encodes a data page. The light source generates a reference beam incident on each hologram within the medium to produce a reconstructed signal beam containing the data page encoded by the hologram. The reference and reconstructed signal beams define a beam plane and a normal to the beam plane. The cross-section of the reconstructed signal beam at the medium is optically obliquely oriented relative to the normal. The detector is positioned in the path of the reconstructed signal beam, and is obliquely oriented relative to the normal. The detector retrieves the data page encoded by the reconstructed signal beam.

DESCRIPTION OF THE FIGURES

FIG. 2-A shows a schematic perspective view of part of the system of FIG. 1, including a storage medium and obliquely-oriented signal beam encoder and detector, according to a preferred embodiment of the present invention.

FIG. 2-B shows a top view of the system of FIG. 2-A.

FIG. 4 illustrates schematically in a perspective view the variation of the spatial extent occupied by the signal beam cross-section between the encoder plane and the Fourier plane for the system of FIG. 2-A.

FIG. 5-A illustrates schematically a normalized extent of the signal beam transverse cross-section near the data encoder in the system of FIG. 2-A.

FIG. 5-B illustrates schematically a normalized extent of a signal beam transverse cross-section between the encoder and the Fourier plane in the system of FIG. 2-A.

FIG. 5-C illustrates schematically a normalized extent of a signal beam transverse cross-section at or close to the Fourier plane in the system of FIG. 2-A.

DETAILED DESCRIPTION

In the following discussion, unless otherwise stated, descriptions of signal and reference beam orientations are understood to refer to beam orientations at the storage medium. Unless otherwise stated, all distances are understood to be effective air pathlengths (which take into account the effects of any refractive optics) rather than physical pathlengths. The optical distance between two elements may be related to the physical distance between the elements by taking into account the effects of any refractive optics positioned between the elements. Also, unless otherwise stated, the term "near-Fourier" is understood to encompass both the Fourier plane and suitable off-Fourier locations. For a data encoder with a square cross section the term near-Fourier generally encompasses locations for which the extent of the corresponding signal beam in a direction parallel to the diagonal to the encoder is greater than the extent of the corresponding signal beam in a direction parallel to either edge of the encoder, as will be described in more detail in the ensuing description on the near-Fourier arrangement.

Preferred System

Figure 1:
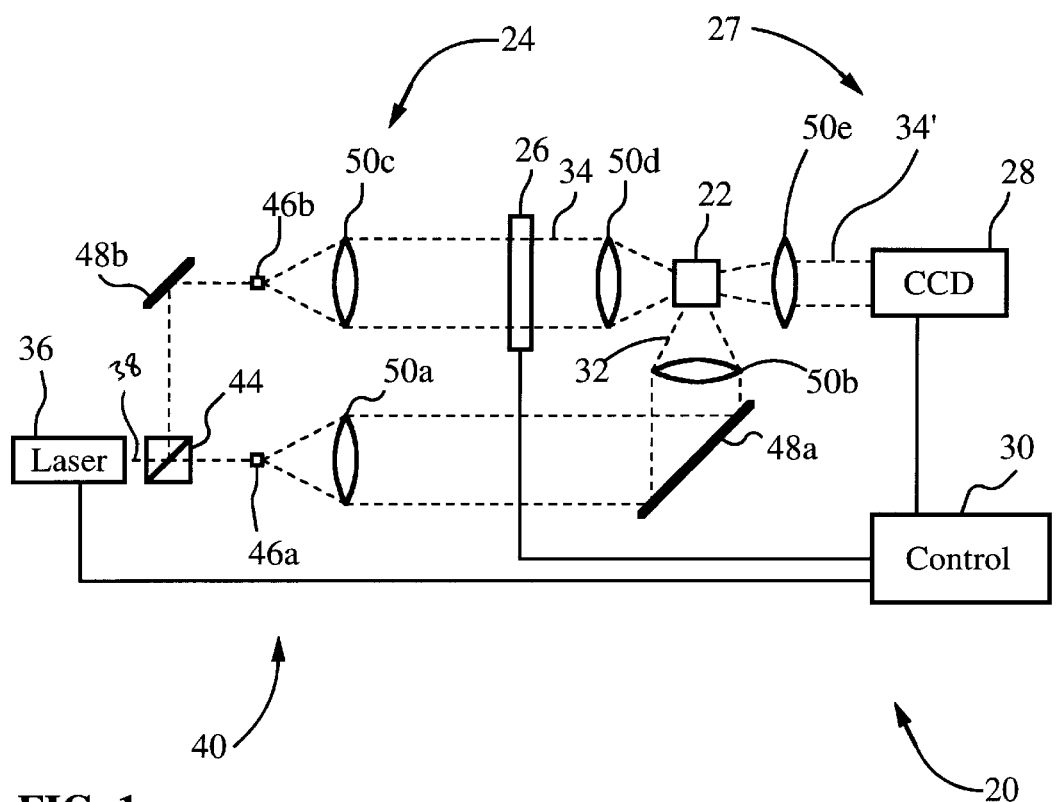
FIG. 1 shows a schematic diagram of a holographic storage system of the present invention.

FIG. 1 is a schematic diagram of a presently preferred holographic data storage and retrieval system 20 of the present invention. In FIG. 1, electrical connections are illustrated by solid lines while light beams are shown by dashed lines. System 20 comprises a volume holographic storage medium 22, a light source 24, a signal beam data encoder 26, and detection optics 27, all in mutual optical communication. System 20 further comprises control electronics 30 in electrical communication with light source 24, encoder 26, and detection optics 27.

Medium 22 can be packaged in a conventional storage device (not shown), which may be removed from system 20. Light source 24 generates a reference beam 32 and a signal beam 34, and directs reference beam 32 and signal beam 34 onto distinct, perpendicular faces of medium 22. Beams 32, 34 are mutually perpendicular within medium 22. Light source 24 comprises a laser 36 for generating a primary light beam 38, and optics 40 for generating beams 32, 34 from primary beam 38 and for directing beams 32, 34 onto medium 22. Optics 40 comprise: a beam splitter 44 for splitting primary beam 38 into beams 32, 34; beam expanders 46a–b for expanding beams 32, 34; mirrors 48a–b for directing beams 32, 34; and lenses 50a–d for focusing beams 32, 34, respectively.

Encoder 26 is situated in the path of signal beam 34, between laser 36 and medium 22. Encoder 26 is preferably an electronically-controllable, transmissive amplitude spatial light modulator (ASLM). Encoder 26 selectively alters the amplitude and/or phase (preferably amplitude only) of the components of signal beam 34 passing through individual pixels of encoder 26. Encoder 26 encodes data in signal beam 34 as a two-dimensional pattern of dark (non-transmissive) and light (transmissive) rectangular pixels.

Detection optics 27 comprise a readout lens 50e and a detector 28 in mutual optical communication, and in optical communication with medium 22. Detector 28 is preferably a rectangular charge-coupled device (CCD) array having rectangular pixels. Lens 50e serves to focus a reconstructed signal beam 34' onto detector 28.

During storage, both beams 32 and 34 are simultaneously incident on medium 22. Data encoder 26 encodes a data page into signal beam 34, and the interference pattern resulting from the interference of beams 32, 34 within medium 22 is stored as a hologram or holographic grating. The hologram is stored within the entire subvolume of medium 22 within which beams 32, 34 overlap. Different data pages are multiplexed within medium 22 by storing each page using a different reference beam. Suitable multiplexing techniques include angular, wavelength, phase-code, and combinations of such multiplexing techniques.

During readout, only reference beam 32 is incident on medium 22. Reference beam 32 interacts with a corresponding hologram within medium 22, generating a reconstructed signal beam 34'. Beam 34' is proportional to the original signal beam 34 recorded using reference beam 32. Beam 34' encodes the information of beam 34 as a pattern of high and low amplitudes of plane wave components corresponding to the dark and light pixels of encoder 26.

FIG. 2-A shows a schematic perspective view of part of system 20 including medium 22, encoder 26, and detector 28. FIG. 2-B shows a top view of the system of FIG. 2-A. The plane defined is by beams 32 and 34 is shown as the horizontal plane, and is illustrated as 37. The normal to plane 37 is illustrated by the vertical arrow 39. Medium 22 comprises distinct storage subvolumes 23a–c stacked along a vertical stacking direction coinciding with normal 39. Subvolumes 23a–c are independently accessible by beams 32, 34. Medium 22 is preferably mounted on a carriage (not shown) capable of sliding medium 22 along normal 39 relative to beams 32, 34, so as to position any desired subvolume 23a–c at the intersection of beams 32, 34.

Signal beam encoder 26, medium 22, and detector 28 are positioned in a near-Fourier arrangement. The centers of medium 22 and encoder 26 are situated approximately at a distance f from lens 50d on opposite sides of lens 50d, where f is the focal distance of lens 50d. Encoder 26 is positioned in the front focal plane of lens 50d, while medium 22 is positioned at or near the Fourier plane (back focal plane). The Fourier plane offers the smallest cross-section for signal beam 34, and thus potentially a relatively high data packing density within medium 22. At the same time, in some systems, signal beam 34 may exhibit undesirably high intensity variations at the Fourier plane. Such intensity variations may limit system performance parameters such as capacity or bit error rate. The intensity variations of signal beam 34 may be reduced by placing a phase mask between encoder 26 and medium 22, or by placing medium 22 away from the Fourier plane. For example, the placement of medium 22 may be chosen so as to optimize some system parameter such as capacity or bit error rate.

Lens 50e is positioned a distance f+f' away from lens 50d, where f' is the focal length of lens 50e. As defined above, the distance f+f' is an optical rather than a physical distance. As is apparent to the skilled artisan, the optical distance between lenses 50d and 50e can be readily related to the corresponding physical distance by taking into account the effect of medium 22, which has a non-unity index of refraction, on the pathlength of signal beam 34. Detector 28 and medium 22 are positioned approximately a distance f' away from lens 50e, on opposite sides of lens 50e. Detector 28 is positioned at the back focal plane of lens 50e, such that data encoded in near-Fourier holograms in medium 22 is imaged onto detector 28. In order to allow a relatively compact arrangement for system 20, it is preferred that f'=f.

Cross-Section Orientation and Subvolume Stacking

Figure 3:
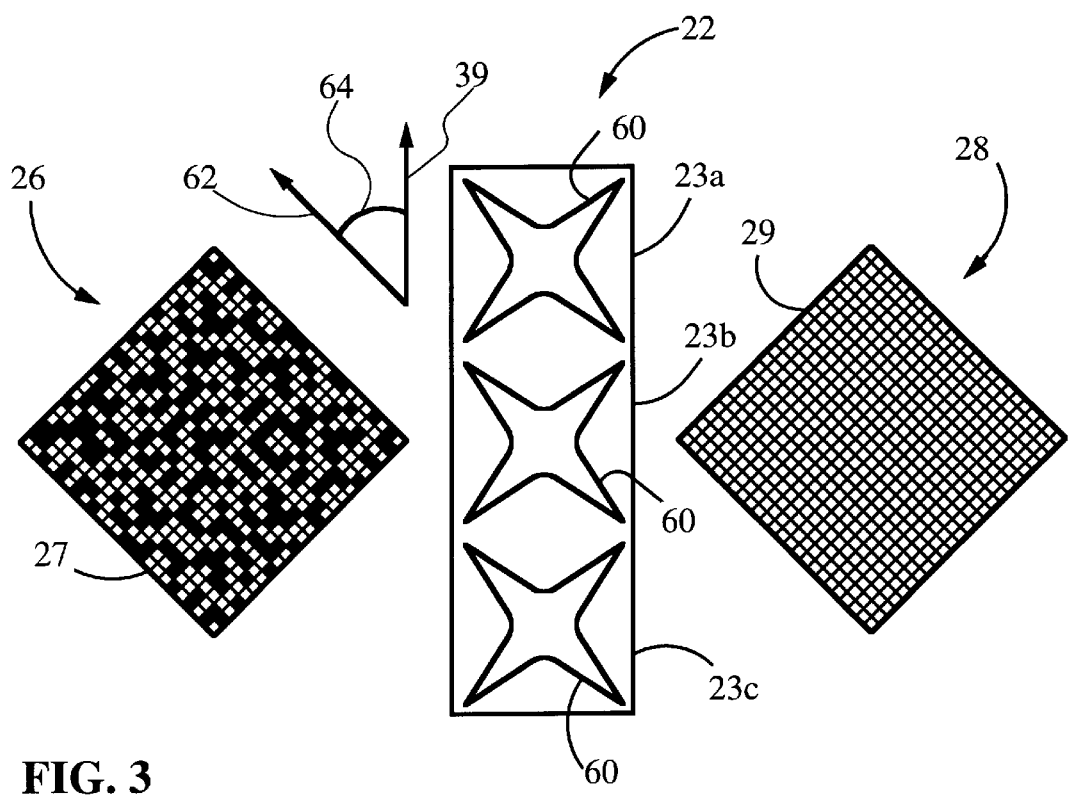
FIG. 3 shows side-by-side schematic front views of the signal beam encoder, medium, and detector of FIG. 2-A, including transform patterns of the encoder at three stacked storage subvolumes of the medium.

FIG. 3 shows side-by-side schematic front views of encoder 26, medium 22, and detector 28. Transverse cross-sections 60 of signal beam 34 at medium 22 represent the near-Fourier transform patterns of encoder 26 at medium 22. Cross-sections 60 are the sections through signal beam 34 within the plane orthogonal to the direction of propagation of beam 34. Cross-sections 60 corresponding to subvolumes 23a–c are stacked along normal 39. Cross-sections 60 are substantially cross-shaped and have an oblique orientation relative to normal 39. The orientation of cross-sections 60 is marked 62. The oblique angle 64 between orientation 62 and normal 39 is between 30° and 60°, preferably about 45°.

Encoder 26 is situated at an optically oblique orientation relative to normal 39. That is, encoder 26 is oriented such that cross-sections 60 are obliquely oriented relative to normal 39. Preferably, in the absence of beam rotation optics between encoder 26 and medium 22, encoder 26 is physically obliquely oriented to normal 39. As is apparent to the skilled artisan, the actual physical orientation of encoder 26 may be arbitrary, provided suitable rotation optics (e.g. prisms, mirrors) are used between encoder 26 and medium 22 to rotate the cross-section of beam 34 by a desired angle.

Preferably, both the individual pixels 27 of encoder 26 and the overall arrangement of pixels 27 have square shapes, and are optically oriented obliquely to normal 39. The spreading of beam 34 into a cross is caused primarily by diffraction from the edges of pixels 27. Consequently, the optical orientation of encoder 26 is primarily determined by the optical orientation of the edges of its individual pixels 27.

Detector 28 is likewise optically obliquely oriented relative to normal 39, and optically aligned to encoder 26 such that pixels 27 are imaged onto pixels 29. Pixels 27 are preferably imaged effectively one-to-one onto pixels 29. The orientation of normal 39 with respect to detector 28 is determined by the plane defined by the reference beam 32 used during readout and the corresponding reconstructed signal beam 34'.

The oblique orientations of cross-sections 60 relative to vertical stacking direction 39 allows a higher packing density of subvolumes 23a–c in the plane of cross-sections 60, both vertically and horizontally. The vertical and horizontal spatial extents occupied by subvolumes 23a–c are each lower by a factor of $\sqrt{2}$ for a 45° oblique angle, as compared to a 0° or 90° angle between the encoder and normal orientations.

Near-Fourier Arrangement

The dependence of spatial extents occupied by subvolumes 23a–c on the positioning of medium 22 relative to encoder 26 can be estimated by considering a simplified illustration of the area occupied by the cross-section of beam 34 at different distances from encoder 26. FIG. 4 shows a schematic perspective view of signal beam 34 illustrating approximate areas occupied by its cross-section between encoder 26 and the Fourier plane. For clarity of presentation, FIG. 4 is a simplified illustration and does not show the curvature of signal beam 34, the actual cross-sections of beam 34, or the focusing effect of lens 50d on beam 34.

FIGS. 5-A through 5-C show front views of the approximate areas occupied by signal beam 34 near encoder 26, between encoder 26 and the Fourier plane, and at the Fourier plane, respectively. The areas shown provide approximate estimates of the sizes of the actual cross-sections. For example, the illustrated diamond-shaped area 65 in the Fourier plane provides an approximate estimate of the size of the actual cross-shaped cross-section 60 of signal beam 34 in the Fourier plane. The areas in FIGS. 5-A through 5-C are individually normalized with respect to the extent w(0) of each area along the orientation 62 of encoder 26. The normalized extent of each area along a direction oriented at 45° to orientation 62 is marked as w(45). In the preferred embodiment, for which the angle between orientation 62 is at 45° with respect to normal 39, w(45) characterizes the extent of the cross-section of signal beam 34 along normal 39.

FIG. 5-A illustrates an area 61 occupied by signal beam 34 at or near encoder 26. For area 61, w(0)<w(45). FIG. 5-B illustrates an area 63 occupied by signal beam 34 at a point between encoder 26 and the Fourier plane for which w(0)=w(45). The location of area 63 defines a boundary 64 of the near-Fourier range for a 45° oblique angle between orientation 62 and normal 39. Another boundary 64' of the near-Fourier range is defined by the location opposite boundary 64 relative to the Fourier plane for which w(0)=w(45). FIG. 5-C illustrates an area 65 occupied by signal beam 34 at the Fourier plane, for which w(0)>w(45). For a placement of encoder 26 in a near-Fourier arrangement relative to medium 22, orienting encoder 26 obliquely relative to normal 39 allows a reduction in the spatial extent of cross-section 60 along normal 39.

Spatial Frequency Filtering

Figure 6:
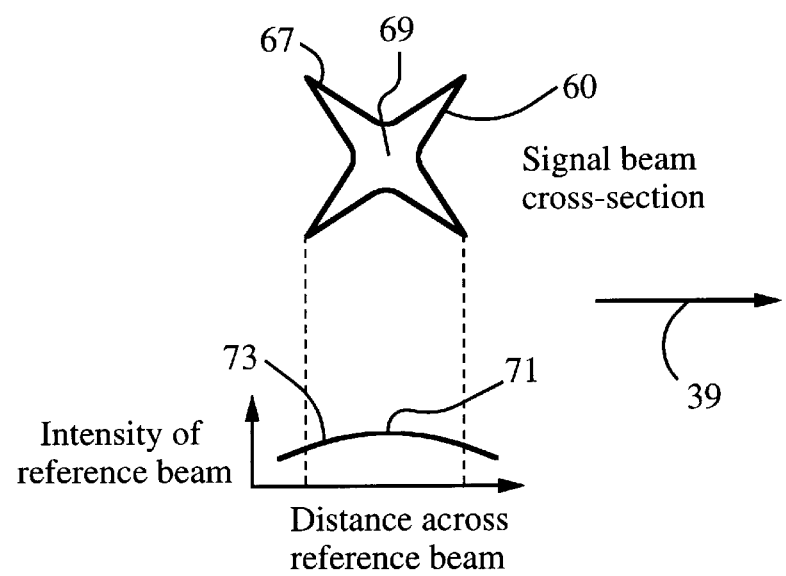
FIG. 6 illustrates schematically the intensity distribution of the reference beam across the signal beam cross-section in the system of FIG. 2-A.

Moreover, the oblique orientation of cross-section 60 relative to normal 39 provides for relatively uniform spatial frequency filtering of signal beam 34. FIG. 6 shows a schematic front view of cross-section 60 and the envelope of the intensity distribution of reference beam 32 across cross-section 60. The intensity envelope follows a Gaussian pattern. The middle 71 of reference beam 32, where the intensity of beam 32 is maximal, overlaps and interferes with the middle 69 of cross-section 60. The edges 73 of reference beam 32, where the intensity of beam 32 is minimal, overlap and interfere with the tips 67 of cross-section 60.

Signal beams 34, 34' store low spatial frequencies in the middle 69 of their corresponding cross-sections 60, and high spatial frequencies at tips 67. High spatial frequencies are needed to define sharp transitions between the spatial extents of the plane-wave components of beam 34', and consequently between the signals detected by pixels 29. Loss of high spatial frequency information leads to blurring between the components of beam 34', and to correlation between the signals detected by adjacent pixels 29. The bit (dark/light) encoded by a given pixel 27 is no longer imaged one-to-one onto a pixel 29 of detector 28, but rather it is partially imaged onto neighboring pixels of detector 28 as well, albeit at relatively low intensity. The reconstruction efficiency for high spatial frequencies may limit the readout resolution, pixel size, and/or intersymbol interference (ISI) performance of system 20. As shown in FIG. 4, all four tips 67 are illuminated by reference beam 32 at similar intensities.

Consider by contrast a system in which the cross-section of the signal beam at medium 22 is aligned to normal 39, i.e. oriented non-obliquely with respect to normal 39. The cross-section is then oriented as a "+" sign, with a horizontal segment in the plane of the reference and signal beams, and a vertical segment along normal 39. The entire horizontal segment of the "+" is illuminated by the middle of the reference beam at relatively high intensity. The vertical segment of the "+" is illuminated non-uniformly: its center is illuminated at high intensity by the middle of the reference beam, while its tips are illuminated at lower intensity by the edges of the reference beam. The non-uniformity in beam overlap effectively leads to non-uniform spatial frequency filtering. Information loss occurs primarily at high spatial frequencies in the vertical direction. Thus, excessive intersymbol interference can occur between vertically adjacent pixels of the detector.

For identical reference beam intensity distributions, the minimum reference beam intensity at the tips of the signal beam cross-section is higher in the obliquely oriented system illustrated in FIG. 4 than in a non-obliquely oriented system.

In the geometry of FIG. 4, the high spatial frequencies at all tips of signal beam cross-section 60 are located relatively evenly close to the middle of the reference beam, and are illuminated by relatively high and similar intensities of reference beam 32. In a non-oblique geometry, the high spatial frequencies along one direction are located relatively far away from the middle of the reference beam.

It will be clear to one skilled in the art that the above embodiments may be altered in many ways without departing from the scope of the invention. Suitable lasers and optics for generating, guiding and controlling signal and reference beams are well known in the art. As is apparent to the skilled artisan, focusing and directing light beams can be performed using various arrangements of optical components. Mirrors may be used with or instead of lenses for focusing and Fourier transforming. Fourier arrangements other than the 4-f (f-2f-f) lens arrangement described above are known in the art and may be used. Examples of Fourier optical arrangements can be found in Goodman, *Introduction to Fourier Optics,* McGraw Hill, 1968. Various components such as prisms and associated mirrors can be used for rotating the cross-section of the signal beam. The data encoder need not be a transmissive, amplitude-only SLM. Suitable encoders include deformable-mirror spatial light modulators, phase-and-amplitude spatial light modulators, and phase and/or amplitude masks. For example, a deformable mirror SLM may be advantageous if it is desired that the SLM not rotate the polarization of reflected light. The detector need not be a CCD array. A camera with a continuous (non-discrete) readout surface may be used. Various spatial multiplexing geometries and subvolume arrangements may be used. The terms "horizontal" and "vertical" are used above for illustration purposes to refer to the relative orientations of the beam plane and the normal to the plane; the terms do not refer to absolute orientations.

Accordingly, the scope of the invention should be determined by the following claims and their legal equivalents.

What is claimed is:

1. A method of optimizing a packing density of holograms in a holographic storage medium, said method comprising the steps of:

a) generating a signal beam and a reference beam, said signal and reference beams defining a plane;

b) encoding a first data page in said signal beam, using an encoder having an oblique optical orientation with respect to a normal to said plane;

c) relaying said signal and reference beams to said storage medium, an overlap of said signal and reference beams within said storage medium defining a first storage subvolume; and d) holographically storing said first data page in said first storage subvolume;

wherein said oblique optical orientation is selected to minimize a length parallel to said normal of said first storage subvolume.

2. The method of claim 1, wherein said encoder comprises square pixels, and wherein an angle between said oblique optical orientation and said normal is substantially equal to 45°.

3. The method of claim 1, wherein said signal beam is substantially perpendicular to said reference beam when said signal and reference beams enter said storage medium.

4. The method of claim 1, further comprising the following steps:

a) encoding a second data page in said signal beam, using said encoder having said oblique optical orientation; and b) holographically storing said second data page in a second storage subvolume of said storage medium;

wherein said first and second storage subvolumes are stacked in a direction parallel to said normal.

5. A method of optimizing a packing density of holograms in a holographic storage medium, said method comprising the steps of:

a) generating a signal beam and a reference beam, wherein said signal and reference beams propagate in a plane;

b) using an encoder to encode a first data page in said signal beam;

c) adjusting an optical orientation of said encoder to give a cross-section of said signal beam an oblique orientation with respect to a normal to said plane;

d) positioning said storage medium in a near-Fourier range of said signal beam;

e) directing said reference beam to said storage medium, thereby creating a first storage subvolume of said storage medium wherein said signal and reference beams overlap; and f) holographically storing said first data page in said first storage subvolume;

wherein said optical orientation of said encoder is adjusted to minimize a length parallel to said normal of said first storage subvolume.

6. The method of claim 5, wherein said encoder comprises square pixels, and wherein an angle between said normal and said optical orientation of said encoder is substantially equal to 45°.

7. The method of claim 5, wherein said signal beam is substantially perpendicular to said reference beam within said storage medium.

8. The method of claim 5, further comprising the following steps:

a) using said encoder to encode a second data page in said signal beam; and b) holographically storing said second data page in a second storage subvolume of said storage medium;

wherein said first and second storage subvolumes are stacked in a direction parallel to said normal.

* * * * *